(12) United States Patent
Schumaker et al.

(10) Patent No.: US 10,120,276 B2
(45) Date of Patent: Nov. 6, 2018

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventors: Philip D. Schumaker, Austin, TX (US); Yeshwanth Srinivasan, Austin, TX (US); Masahiro Tamura, Utsunomiya-shi (JP); Takuro Yamazaki, Utsunomiya-shi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 334 days.

(21) Appl. No.: 14/674,244

(22) Filed: Mar. 31, 2015

(65) Prior Publication Data

US 2016/0288404 A1    Oct. 6, 2016

(51) Int. Cl.
*B29C 59/02* (2006.01)
*G03F 7/00* (2006.01)

(52) U.S. Cl.
CPC .................................. *G03F 7/0002* (2013.01)

(58) Field of Classification Search
None
See application file for complete search history.

(56) References Cited

U.S. PATENT DOCUMENTS

| 7,670,529 | B2 | 3/2010 | Choi et al. | |
| 2007/0141271 | A1* | 6/2007 | Xu | B82Y 10/00 |
| | | | | 427/508 |
| 2007/0228593 | A1* | 10/2007 | Jones | B29C 43/003 |
| | | | | 264/40.4 |
| 2011/0309548 | A1 | 12/2011 | Aihara | |
| 2012/0057100 | A1* | 3/2012 | Masuda | B29C 33/3878 |
| | | | | 349/62 |
| 2013/0020281 | A1 | 1/2013 | Wakamatsu et al. | |

FOREIGN PATENT DOCUMENTS

| JP | 2011228619 A | 11/2011 |
| TW | 200730325 A | 8/2007 |
| TW | 201206687 A | 2/2012 |

OTHER PUBLICATIONS

Office Action issued in Taiwanese Appln. No. 105109721 dated Mar. 16, 2017. English translation provided.

* cited by examiner

*Primary Examiner* — Joseph A Miller, Jr.
(74) *Attorney, Agent, or Firm* — Rossi, Kimms & McDowell LLP (57) ABSTRACT

The present invention provides an imprint apparatus which forms a pattern on a substrate by molding an imprint material on the substrate using a mold, comprising a supply unit configured to supply droplets of the imprint material onto the substrate; and a processing unit configured to acquire arrangement patterns of the droplets on the substrate, wherein based on the arrangement pattern corresponding to a first portion of the mold and the arrangement pattern corresponding to a second portion of the mold, the processing unit acquires the arrangement pattern corresponding to a boundary portion between the first portion and the second portion.

15 Claims, 5 Drawing Sheets

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus which molds an imprint material on a substrate using a mold is attracting attention as one of mass-production lithography apparatuses such as semiconductor devices. The imprint apparatus includes a plurality of nozzles which discharge droplets of the imprint material toward the substrate. The imprint apparatus supplies the imprint material onto the substrate by controlling discharge of droplets from respective nozzles according to a predetermined droplet arrangement pattern on the substrate.

In the imprint apparatus, the residual film of the pattern of the imprint material molded by the mold is preferably uniform. The residual film indicates the thickness of the imprint material between the substrate and the concave portions of a three-dimensional pattern formed by the imprint material (or a pattern formed by curing the imprint material). Japanese Patent Laid-Open No. 2011-228619 proposes a method of, when molding an imprint material using a mold on which a line pattern is formed, improving the uniformity of the residual film of the imprint material molded by the mold. When the imprint material and the mold on which the line pattern is formed are brought into contact with each other, the speeds at which the imprint material spreads in the longitudinal direction and widthwise direction of the line pattern are different from each other, thereby impairing the uniformity of the residual film of the imprint material. According to Japanese Patent Laid-Open No. 2011-228619, the uniformity of the residual film of the imprint material is improved by making the interval between droplets of the imprint material supplied onto the substrate smaller in the widthwise direction of the line pattern than in the longitudinal direction of the line pattern.

In the imprint apparatus, when molding the imprint material using a mold including a plurality of portions with different pattern arrangements, it is preferable to change the arrangement of droplets of the imprint material supplied onto the substrate in accordance with the pattern arrangement of each portion of the mold. In this case, if the arrangements of droplets in two adjacent portions among the plurality of portions of the mold are different, the amount of the imprint material deviates from a necessary amount in the boundary portion between the two portions, and thus the residual film of the imprint material molded by the mold may become nonuniform.

SUMMARY OF THE INVENTION

The present invention provides, for example, an imprint apparatus advantageous in terms of the uniformity of an obtained residual film.

According to one aspect of the present invention, there is provided an imprint apparatus which forms a pattern on a substrate by molding an imprint material on the substrate using a mold, comprising: a supply unit configured to supply droplets of the imprint material onto the substrate; and a processing unit configured to acquire arrangement patterns of the droplets on the substrate, wherein based on the arrangement pattern corresponding to a first portion of the mold and the arrangement pattern corresponding to a second portion of the mold, the processing unit acquires the arrangement pattern corresponding to a boundary portion between the first portion and the second portion.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

<First Embodiment>

An imprint apparatus 100 according to the first embodiment of the present invention will be described. The imprint apparatus 100 is used to manufacture a semiconductor device or the like, and performs imprint processing of molding an imprint material 6 on a substrate using a mold 1. For example, the imprint apparatus 100 cures the imprint material 6 while the imprint material 6 on the substrate is molded by pressing the mold 1 on which a three-dimensional pattern is formed. The imprint apparatus 100 can widen the spacing between the mold 1 and a substrate 4, and separate (release) the mold 1 from the cured imprint material 6, thereby forming a pattern obtained by curing the imprint material 6 on the substrate.

Examples of a method of curing the imprint material 6 are a heat cycle method using heat and a photo-curing method using light. An example in which the photo-curing method is adopted will be explained in the first embodiment. The photo-curing method is a method of curing the imprint material 6 by supplying an uncured ultraviolet-curing resin as the imprint material 6 onto the substrate, and irradiating the imprint material 6 with ultraviolet rays while the mold 1 and the imprint material 6 are in contact with each other. Although a case in which ultraviolet rays are used as light will be described here, light with a different wavelength may be used.

Figure 1:
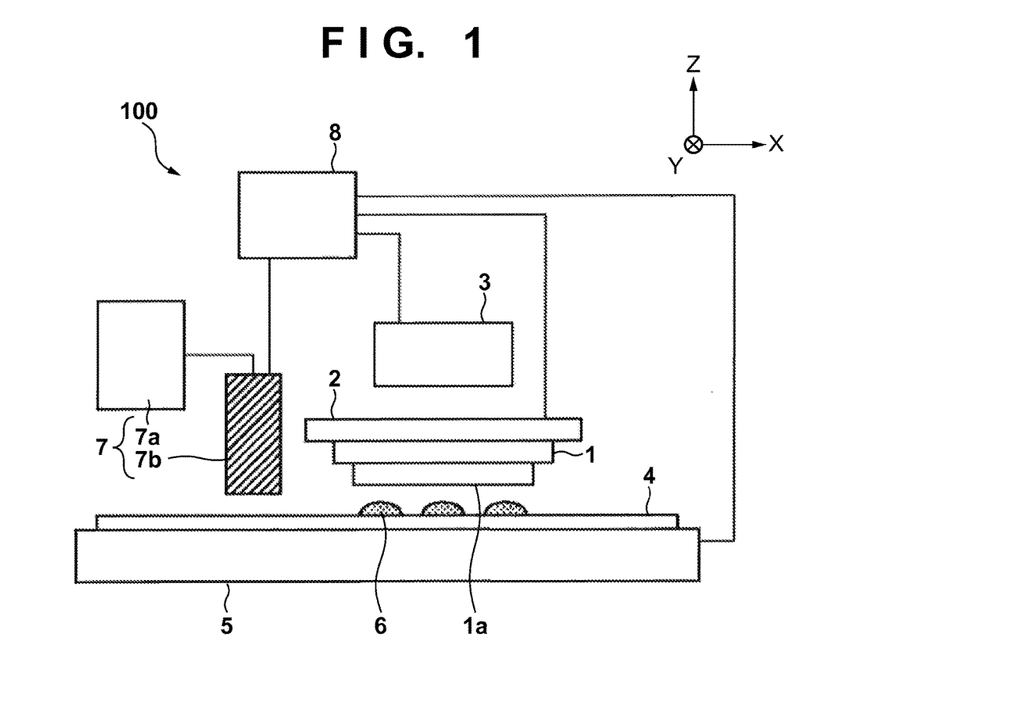
FIG. 1 is a schematic view showing an imprint apparatus according to the first embodiment.

FIG. 1 is a schematic view showing the imprint apparatus 100 according to the first embodiment. The imprint apparatus 100 can include a mold stage 2 which holds the mold 1, a substrate stage 5 which holds the substrate 4, and a curing unit 3 which cures the imprint material 6 by irradiating the imprint material 6 on the substrate with light. The imprint apparatus 100 can also include a supply unit 7 which supplies the imprint material 6 to the substrate 4, and a control unit 8. The control unit 8 includes, for example, a CPU and a memory, and controls imprint processing (controls each unit of the imprint apparatus 100).

The mold 1 is generally made of a material such as quartz capable of transmitting ultraviolet rays. A partial region (pattern region 1a) on a substrate-side surface of the mold 1 includes, for example, a plurality of portions including the first portion and the second portion which are adjacent to each other. In the first embodiment, a case will be described in which the first portion includes a three-dimensional line pattern formed from a plurality of line elements each extending in the first direction (for example, the Y direction), and the second portion includes no three-dimensional pattern. The first portion is a portion in which the imprint material 6 on an underlying pattern already formed on the substrate 4 is molded, and the second portion is a portion in which the imprint material 6 on a scribe region of the substrate 4 is molded. However, the present invention is not limited to them, and the first and second portions of the mold 1 need only have different arrangements. As the substrate 4, for example, a single-crystal silicon substrate or SOI (Silicon on Insulator) substrate can be used. The supply unit 7 (to be described later) supplies the imprint material 6 to the upper surface (processed surface) of the substrate 4.

The mold stage 2 holds the mold 1 by, for example, a vacuum suction force or an electrostatic force, and moves in the Z direction together with the mold 1 so as to bring the pattern region 1a of the mold 1 and the imprint material 6 on the substrate into contact with each other, or separate them from each other. In addition to the function of moving the mold 1 in the Z direction, the mold stage 2 may have a function of adjusting the position of the mold 1 in the X and Y directions and the θ direction (rotational direction around the Z-axis), a tilt function of adjusting the tilt of the mold 1, and the like.

The substrate stage 5 holds the substrate 4 by, for example, a vacuum suction force or an electrostatic force, and aligns the substrate 4 in the X and Y directions. The substrate stage 5 may have not only the function of moving the substrate 4 in the X and Y directions but also a function of moving the substrate 4 in the Z direction, a function of adjusting the position of the substrate 4 in the θ direction, a tilt function of adjusting the tilt of the substrate 4, and the like. In the imprint apparatus 100 of the first embodiment, the mold stage 2 performs an operation of changing the distance between the mold 1 and the substrate 4. The present invention, however, is not limited to this. This operation may be performed by the substrate stage 5 or by both the mold stage 2 and the substrate stage 5.

In imprint processing, the curing unit 3 irradiates the imprint material 6 supplied onto the substrate with light (ultraviolet rays) to cure the imprint material 6. The curing unit 3 includes, for example, a light source which emits light (ultraviolet rays) for curing the imprint material 6. The curing unit 3 may also include an optical element for adjusting light emitted by the light source to an appropriate one for imprint processing. Since the first embodiment adopts the photo-curing method, the light source which emits ultraviolet rays is used. However, for example, when the heat-curing method is adopted, a heat source for curing a heat-curing resin serving as the imprint material 6 can be used in place of the light source.

The supply unit 7 can include a tank 7a which stores the imprint material 6, and a dispenser 7b which supplies the imprint material 6 stored in the tank 7a to the substrate. The dispenser 7b includes a plurality of nozzles each of which discharges droplets of the imprint material 6 toward the substrate 4. The supply unit 7 supplies the imprint material 6 onto the substrate by discharging droplets of the imprint material 6 from each nozzle while the substrate 4 and the supply unit 7 relatively move. When, for example, the plurality of nozzles are arrayed in the Y direction, a step of supplying droplets of the imprint material 6 from each nozzle to the substrate 4 is performed while the substrate 4 moves in a direction (for example, the X direction) different from the array direction of the plurality of nozzles. At this time, the control unit 8 controls discharge or non-discharge (discharge timing) of droplets from each nozzle in accordance with information (to be referred to as arrangement information hereinafter) indicating the arrangement of droplets of the imprint material 6 on the substrate. For example, arrangement information is generated in advance by the control unit 8 or an external computer based on design information of the three-dimensional pattern formed in the pattern region 1a of the mold 1, and the like. In the first embodiment, a case in which the control unit 8 generates arrangement information will be described.

[Imprint Processing]

Imprint processing executed by the imprint apparatus 100 of the first embodiment will be explained. The imprint processing is performed when the control unit 8 controls the respective units of the imprint apparatus 100. The control unit 8 controls a mold conveyance mechanism (not shown) to convey the mold 1 to a position below the mold stage 2, and controls the mold stage 2 to hold the mold 1. A three-dimensional pattern according to the design information is formed on the mold 1 (pattern region 1a), as described above, and an individual ID for identifying the pattern formed on the mold 1 is set. The control unit 8 causes a reading mechanism (not shown) to read the individual ID of the mold 1, thereby acquiring the individual ID. The control unit 8 acquires arrangement information for controlling each of the plurality of nozzles of the dispenser 7b based on the acquired individual ID of the mold 1. The arrangement information may be generated in advance based on the design information of the three-dimensional pattern formed on the mold 1, or may be sequentially generated by reading out the design information of the pattern based on the individual ID. The control unit 8 controls a substrate conveyance mechanism (not shown) to convey the substrate 4 to a position above the substrate stage 5, and controls the substrate stage 5 to hold the substrate 4. The substrate 4 is thus arranged within the imprint apparatus 100.

Figure 2:
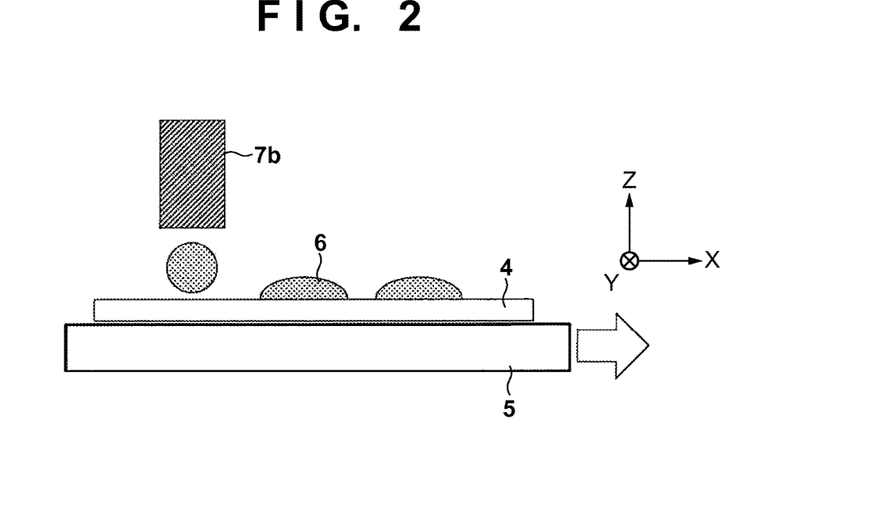
FIG. 2 is a view showing a case in which discharge of droplets from each nozzle is controlled.
Figure 3A:
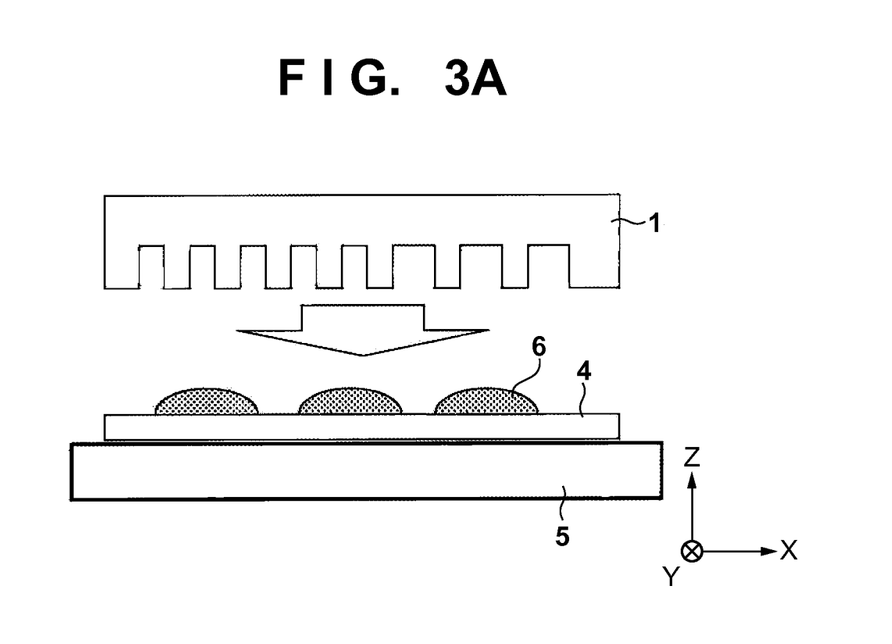
FIG. 3A is a view showing a state before a mold and an imprint material are brought into contact with each other.
Figure 3B:
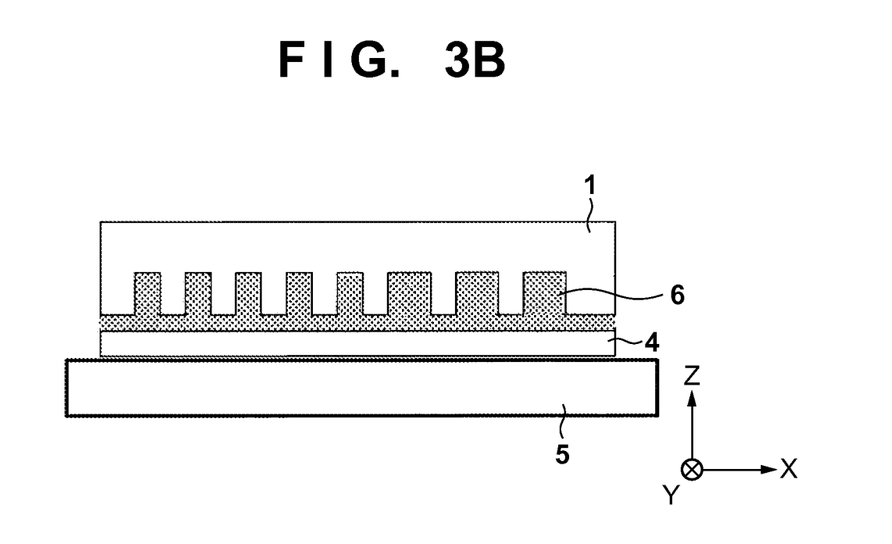
FIG. 3B is a view showing a state after the mold and the imprint material are brought into contact with each other.

The control unit 8 controls the supply unit 7 to supply the imprint material 6 to a shot region to which the pattern of the mold 1 is to be transferred. For example, as shown in FIG. 2, the control unit 8 controls discharge of droplets from each nozzle according to the acquired arrangement information while moving the substrate 4 in the X direction. After supplying the imprint material 6 to the shot region, the control unit 8 controls the substrate stage 5 to arrange, below the pattern region 1a of the mold 1, the shot region to which the imprint material 6 has been supplied. As shown in FIGS. 3A and 3B, the control unit 8 controls the mold stage 2 to decrease the distance between the mold 1 and the substrate 4, thereby bringing the mold 1 and the imprint material 6 on the substrate into contact with each other. FIG. 3A shows a state before the mold 1 and the imprint material 6 are brought into contact with each other. FIG. 3B shows a state after the mold 1 and the imprint material 6 are brought into contact with each other. The control unit 8 aligns the mold 1 and the substrate 4 while the mold 1 and the imprint material 6 are in contact with each other. For example, the control unit 8 causes an alignment scope (not shown) to detect a mark provided on the mold 1 and a mark provided on the substrate 4, and controls the relative positions of the mold 1 and the substrate 4 using the detected marks of the mold 1 and the substrate 4. Note that a predetermined time preferably elapses while the mold 1 and the imprint material 6 are in contact with each other in order to sufficiently fill the concave portions of the pattern of the mold 1 with the imprint material 6 on the substrate.

Figure 4:
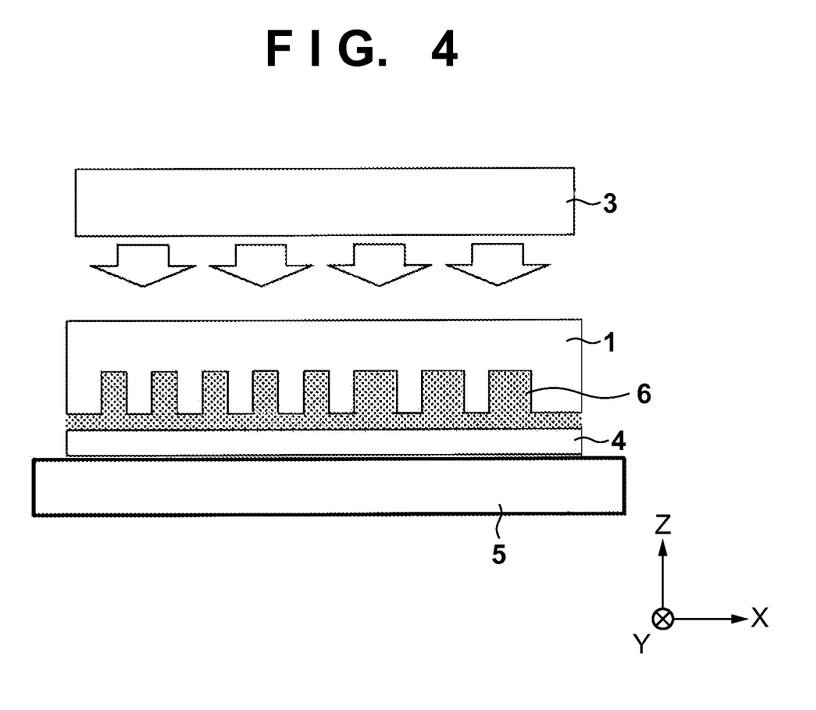
FIG. 4 is a view showing a case in which the imprint material is irradiated with light.
Figure 5:
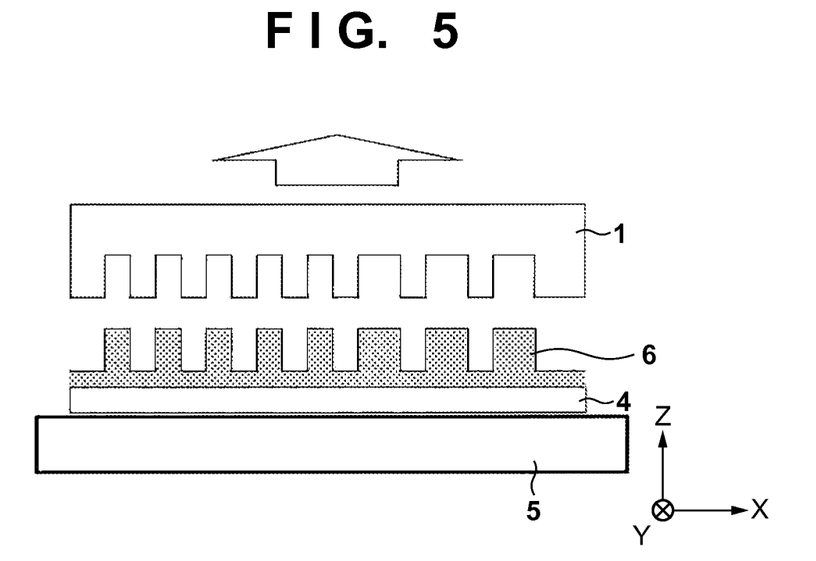
FIG. 5 is a view showing a case in which the mold is separated from the imprint material.

As shown in FIG. 4, the control unit 8 controls the curing unit 3 to irradiate, with light (ultraviolet rays), the imprint material 6 which is in contact with the mold 1, thereby curing the imprint material 6. After the imprint material 6 is cured, the control unit 8 controls the mold stage 2 to increase the distance between the mold 1 and the substrate 4, thereby separating (releasing) the mold 1 from the imprint material 6, as shown in FIG. 5. This can form the pattern based on the imprint material 6 on the shot region. The above-described imprint processing is performed for each of a plurality of shot regions formed on the substrate.

[Arrangement of Droplets]

In the imprint apparatus 100, the residual film of the pattern formed by the mold 1 is preferably uniform. The thickness of the residual film indicates the thickness of the pattern between the substrate 4 and the concave portions of the pattern. However, when the mold 1 and the imprint material 6 are brought into contact with each other, the imprint material 6 can spread in a different way depending on the arrangement of each portion of the mold 1. In the first portion in which the line pattern including the plurality of line elements extending in the first direction is formed, for example, the speed at which the imprint material 6 spreads can be higher in the first direction than in the second direction (for example, the X direction) which is parallel to the substrate surface and perpendicular to the first direction due to capillarity. On the other hand, in the second portion in which no three-dimensional pattern is formed, the speeds at which the imprint material 6 spreads in the first and second directions can be equal to each other. To improve the uniformity of the film thickness of the imprint material 6, it is preferable to change the arrangement of droplets of the imprint material 6 supplied onto the substrate in accordance with the arrangement of each portion of the mold 1.

If the arrangements of droplets in two adjacent portions among the plurality of portions of the mold 1 are different, the amount of the imprint material 6 deviates from a necessary amount in the boundary portion between the two portions. That is, if the arrangements of droplets in the adjacent first and second portions are different, the amount of the imprint material 6 deviates from the necessary amount in the boundary portion between the first and second portions. As a result, the uniformity of the residual film of the imprint material 6 molded by the mold 1 may deteriorate.

To cope with this, in the first embodiment, the control unit 8 decides the arrangement of droplets of the imprint material 6 using a first arrangement pattern 10a in the first region on the substrate, in which the imprint material 6 is molded by the first portion of the mold 1. Furthermore, the control unit 8 decides the arrangement of droplets of the imprint material 6 using a second arrangement pattern 10b in the second region on the substrate, in which the imprint material 6 is molded by the second portion of the mold 1. The first arrangement pattern 10a and the second arrangement pattern 10b have different droplet arrangement patterns, and have, for example, different ratios between the droplet interval in the first direction (Y direction) and that in the second direction (X direction). The control unit 8 decides the arrangement of droplets of the imprint material 6 using the first arrangement pattern 10a and the second arrangement pattern 10b in the boundary region (a region on the substrate corresponding to the boundary portion of the mold 1) on the substrate, which includes part of the first region and part of the second region. By deciding the arrangement of droplets of the imprint material 6 as described above, the control unit 8 can obtain arrangement information. In the first embodiment, a case in which the control unit 8 decides the arrangement of droplets of the imprint material 6 has been explained. The present invention, however, is not limited to this, and an external computer may decide the droplet arrangement. In this case, the control unit 8 acquires arrangement information from the external computer.

[Arrangement Pattern]

Figure 6:
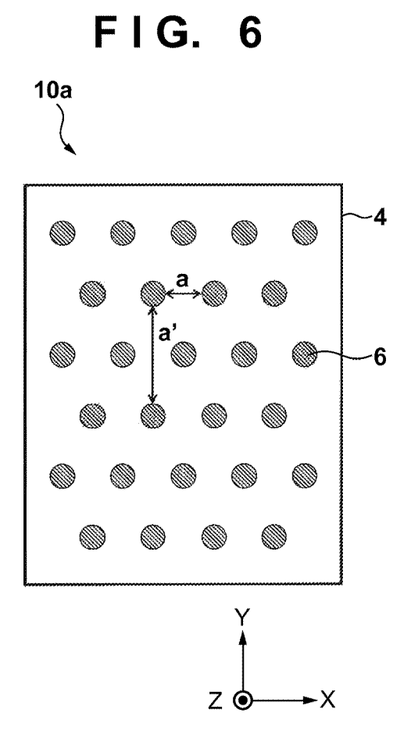
FIG. 6 is a view showing an example of the first arrangement pattern.
Figure 7:
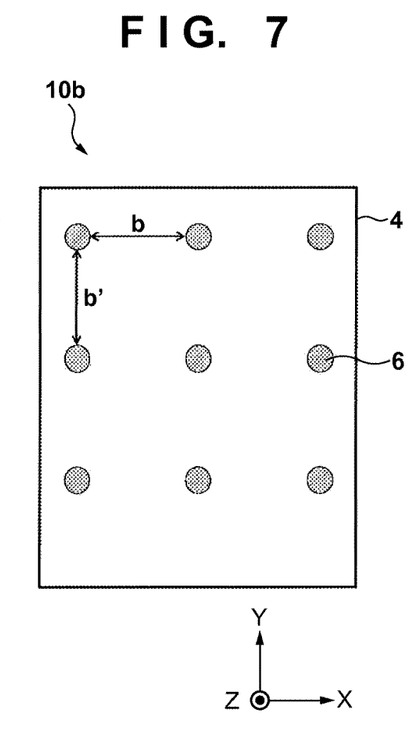
FIG. 7 is a view showing an example of the second arrangement pattern.

Examples of the first arrangement pattern 10a and the second arrangement pattern 10b will be described with reference to FIGS. 6 and 7. FIG. 6 shows an example of the first arrangement pattern 10a. FIG. 7 shows an example of the second arrangement pattern 10b.

The first arrangement pattern 10a is used to decide the droplet arrangement in the first region on the substrate, in which the imprint material 6 is molded by the first portion of the mold 1. As described above, in the first portion of the mold 1, the line pattern is formed, and the speed at which the imprint material 6 spreads is higher in the first direction than in the second direction. Therefore, as shown in FIG. 6, the first arrangement pattern 10a is formed so that the droplet interval is longer in the first direction (Y direction) in which the line elements extend than in the second direction (X direction) (interval a<interval a').

On the other hand, the second arrangement pattern 10b is used to decide the droplet arrangement in the second region on the substrate, in which the imprint material 6 is molded by the second portion of the mold 1. As described above, in the second portion of the mold 1, no three-dimensional pattern is formed, and the speed at which the imprint material 6 spreads in the first direction is equal to that in the second direction. Therefore, as shown in FIG. 7, the second arrangement pattern 10b is formed to have equal droplet intervals in the first direction (Y direction) and the second direction (X direction) (interval b=interval b').

Figure 8:
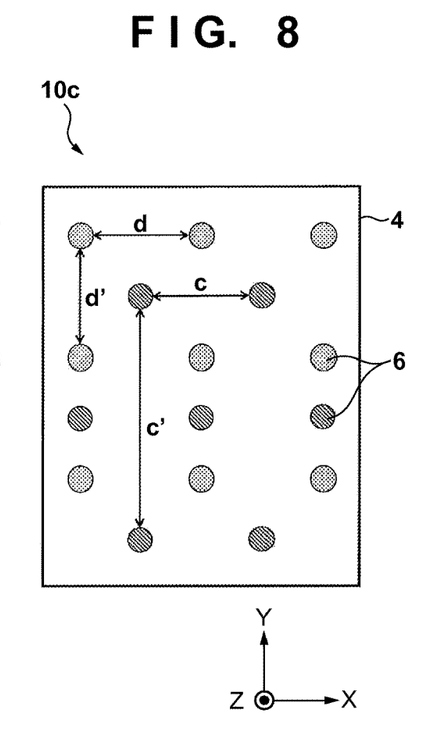
FIG. 8 is a view showing an example of the third arrangement pattern.

In the boundary region on the substrate, which includes part of the first region and part of the second region, the droplet arrangement is decided using a third arrangement pattern 10c. FIG. 8 is a view showing an example of the third arrangement pattern 10c. The third arrangement pattern 10c can be created by combining the first arrangement pattern 10a and the second arrangement pattern 10b. For example, the control unit 8 can create the third arrangement pattern 10c by changing the relative magnifications of the first arrangement pattern 10a and the second arrangement pattern 10b so that the density of droplets in the boundary region on the substrate becomes equal to a target density. That is, the ratio between intervals c and c' in the third arrangement pattern 10c shown in FIG. 8 can be equal to the ratio between the intervals a and a' in the first arrangement pattern 10a. Furthermore, the ratio between intervals d and d' in the third arrangement pattern shown in FIG. 8 can be equal to the ratio between the intervals b and b' in the second arrangement pattern 10b.

[Arrangement Information Generation Method]

An example of an arrangement information generation method will be described. The control unit 8 divides the pattern region 1a into a plurality of unit portions on the design information of the three-dimensional pattern formed in the pattern region of the mold 1, and obtains the volume of the concave portions of the pattern for each unit portions. The control unit 8 calculates the necessary amount of the imprint material 6 for each unit portion based on the obtained volume and the target value of the residual film of the imprint material 6. In this case, it is preferable to separately obtain in advance the volume of the concave portions and the target value of the residual film of the imprint material 6. This is because processing when the target value of the residual film of the imprint material 6 is changed can be simplified. Also, when calculating the necessary amount of the imprint material 6 for each unit portion, it is preferable to consider the evaporation amount of the imprint material 6.

Next, the control unit 8 divides the pattern region 1a of the mold 1 into a plurality of portions according to the arrangement based on the design information. For example, the control unit 8 divides the pattern region 1a of the mold 1 into a plurality of portions including the first portion in which the line pattern is formed and the second portion in which no three-dimensional pattern is formed. The control unit 8 applies the first arrangement pattern 10a to each of the plurality of unit portions in the first portion except for the boundary portion, and applies the second arrangement pattern 10b to each of the plurality of unit portions in the second portion except for the boundary portion. At this time, the control unit 8 preferably changes the magnification of the first arrangement pattern 10a or the second arrangement pattern 10b according to the necessary amount of the imprint material 6 for each unit portion. The control unit 8 applies the third arrangement pattern 10c to each of the plurality of unit portions in the boundary portion. At this time, the control unit 8 preferably changes the magnification of the third arrangement pattern 10c according to the necessary amount of imprint material for each unit portion. As described above, the control unit 8 can decide the droplet arrangement by arraying the arrangement patterns, that is, by applying the arrangement pattern to each unit portion, and generate arrangement information. The control unit 8 can improve the uniformity of the residual film of the imprint material molded by the mold 1 by controlling the supply unit 7 using the acquired arrangement information to supply the imprint material 6 onto the substrate.

Figure 9:
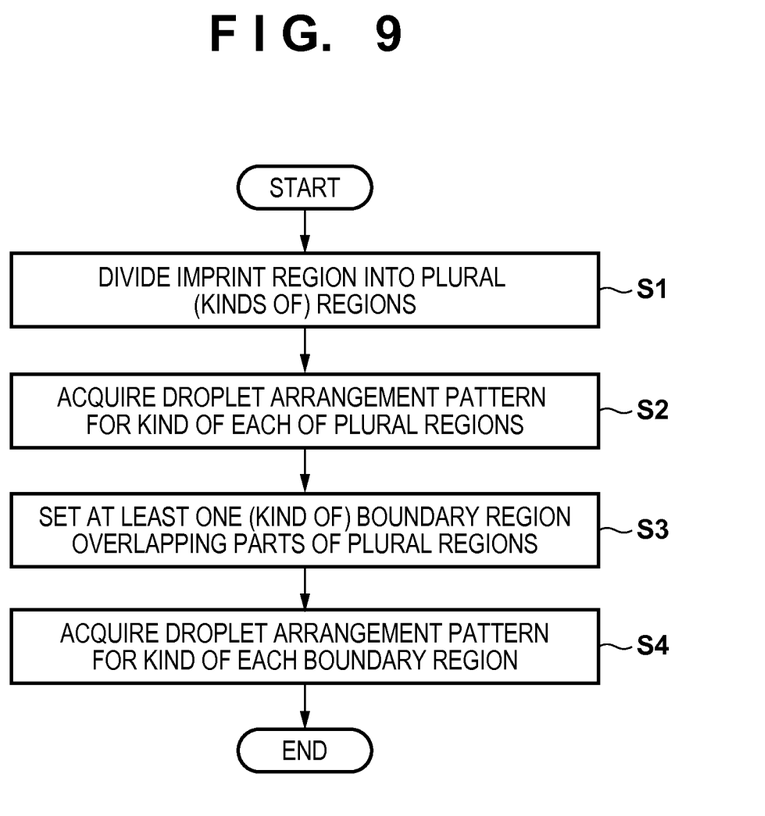
FIG. 9 is a flowchart exemplifying a processing procedure of generating arrangement information.

An example of a processing procedure of generating arrangement information by the control unit 8 or an external computer will now be described with reference to FIG. 9. Note that the control unit 8 or the external computer is a processing unit (which can be formed by including a programmed CPU, DSP, or FPGA) which operates according to a program for executing the processing. Upon start of processing by the control unit 8 or the external computer, an imprint region on the substrate is divided (classified) into a plurality of (kinds of) regions based on the design information (geometric information or the like) of the pattern of the mold 1 in step S1. The imprint region can be divided based on the features of the pattern of the mold 1, such as the anisotropy of the concave portions of the mold, and the area density of the volume of the concave portions. In step S2, a droplet arrangement pattern is acquired (decided) for each of the plurality of regions. The arrangement pattern can be acquired (decided) based on the residual film thickness, the volume (the distribution thereof) and anisotropy of the concave portions of the mold, and the like.

In step S3, at least one boundary region overlapping parts of the plurality of regions is set within the imprint region. The dimensions of each boundary region can be acquired (decided) based on, for example, the volume (the area density thereof) of the concave portions of a region adjacent to the boundary region. In step S4, a droplet arrangement pattern is acquired (decided) for each boundary region. The arrangement pattern can be acquired by enlarging and combining the previously acquired arrangement patterns of the adjacent regions, and deciding the enlargement ratio (magnification) so that the total amount of droplets matches that necessary for the boundary region. As described above, the droplet arrangement patterns within the imprint region are acquired (decided), thereby terminating the processing by the control unit 8 or the external computer.

[Effects of Embodiment]

The effects of this embodiment will be described. Assume that imprint processing is performed using the mold 1 in which a line pattern of 100 nmL/S is formed in half (the first portion) of the pattern region 1a, and no three-dimensional pattern is formed in the other half (the second portion) (that is, the other half is flat). Assume also that the pattern region 1a has a square shape with a side of 10 mm, and the depth of the concave portions of the line pattern formed in the first portion is 60 nm. The result of generating arrangement information so that the thickness of the residual film of the imprint material 6 becomes 15 nm when performing the imprint processing using the mold 1, and actually performing the imprint processing using the mold 1 is as follows. In the imprint processing, two pieces of arrangement information, that is, the first arrangement information and the second arrangement information were used. The first arrangement information is arrangement information generated using the first arrangement pattern 10a, the second arrangement pattern 10b, and the third arrangement pattern 10c by setting a portion of ±250 pm from the boundary between the first and second portions as the boundary portion of the mold 1. The second arrangement information is arrangement information generated using only the first arrangement pattern 10a and the second arrangement pattern 10b without setting any boundary portion. As a result of performing the imprint processing using the first arrangement information, the thickness of the residual film of the imprint material molded by the mold 1 fell within the range of 15±3 nm over the entire region including the boundary region on the substrate, in which the imprint material 6 is molded by the boundary portion of the mold 1. On the other hand, as a result of performing the imprint processing using the second arrangement information, the thickness of the residual film fell within the range of 15±3 nm in a region except for the boundary region on the substrate but fell within the range of 18±5 nm in the boundary region, thereby impairing the uniformity of the residual film. That is, it is possible to improve the uniformity of the residual film of the imprint material 6 molded by the mold 1 by using the method according to this embodiment.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a substrate by using the above-described imprint apparatus (method) (a step of performing imprint processing on the substrate), and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus which forms a pattern of an imprint material on a shot region of a substrate by using a mold including a first portion and a second portion that are adjacent to each other and have different pattern configurations from each other, comprising:
    a supplier configured to supply the imprint material onto the shot region; and
    a processor configured to determine information on an arrangement pattern of the imprint material to be supplied as droplets on the shot region by the supplier, and control the supplier based on the information,
    wherein the processor is configured to:
    obtain a pattern configuration of the first portion of the mold and a pattern configuration of the second portion of the mold;
    obtain a first arrangement pattern of the imprint material generated based on the pattern configuration of the first portion of the mold, and a second arrangement pattern of the imprint material generated based on the pattern configuration of the second portion of the mold,
    specify a boundary portion of the mold where a thickness of the pattern of the imprint material to be formed by the mold cannot be within an allowable range in a case of respectively adopting the first arrangement pattern to the first portion of the mold and the second arrangement pattern to the second portion of the mold, the boundary portion of the mold including a part of the first portion of the mold and a part of the second portion of the mold,
    generate a third arrangement pattern of the imprint material to be
    adopted to the boundary portion of the mold, such that the thickness of the pattern of the imprint material to be formed by the boundary portion of the mold falls within the allowable range, by combining the first arrangement pattern and the second arrangement pattern, and
    determine the information on the arrangement pattern of the imprint material to be supplied as droplets on the shot region by the supplier based on the first arrangement pattern, the second arrangement pattern, and the third arrangement pattern, wherein the pattern configuration of the first portion of the mold includes concave portions extending in a predetermined direction, and the pattern configuration of the second portion of the mold includes no three-dimensional pattern.

2. The apparatus according to claim 1, wherein the the processor is configured to:
    generate the first arrangement pattern of the imprint material based on the pattern configuration in the first portion of the mold, such that a thickness of the pattern of the imprint material to be formed by the first portion of the mold falls within the allowable range, and
    generate the second arrangement pattern of the imprint material based on the pattern configuration in the second portion of the mold, such that a thickness of the pattern of the imprint material to be formed by the second portion of the mold falls within the allowable range.

3. The apparatus according to claim 2, wherein the processor is configured to respectively generate the first arrangement pattern and the second arrangement pattern based on design information on the pattern configuration of the first portion of the mold and the pattern configuration of the second portion of the mold.

4. The apparatus according to claim 1, wherein the processor is configured to generate the third arrangement pattern by combining a first intermediate pattern and a second intermediate pattern, the first intermediate pattern being determined by changing an interval in a first direction and an interval in a second direction while maintaining a ratio between the interval in the first direction and the interval in the second direction with respect to arrangement positions of the imprint material in the first arrangement pattern, the second intermediate pattern being determined by changing an interval in the first direction and an interval in the second direction while maintaining a ratio between the interval in the first direction and the interval in the second direction with respect to arrangement positions of the imprint material in the second arrangement pattern, and the second direction being perpendicular to the first direction.

5. The apparatus according to claim 4, wherein the processor is configured to generate the third arrangement pattern such that a density of the imprint material to be supplied onto the substrate in accordance with the third arrangement pattern becomes equal to a target density.

6. The apparatus according to claim 1, wherein in at least one of the first arrangement pattern and the second arrangement pattern, an interval of arrangement positions of the imprint material in a first direction is different from an interval of arrangement positions of the imprint material in a second direction perpendicular to the first direction.

7. The apparatus according to claim 6, wherein in at least one of the first arrangement pattern and the second arrangement pattern, the interval in the first direction and the interval in the second direction are different from each other according to anisotropy of a pattern of the mold.

8. The apparatus according to claim 2, wherein the processor is configured to generate the first arrangement pattern and the second arrangement pattern based on a volume of concave portions of the mold and a target residual film thickness of a pattern of the imprint material to be formed on the substrate.

9. The apparatus according to claim 1, wherein the processor is configured to generate the third arrangement pattern based on information obtained by enlarging an interval of arrangement positions of the imprint material in the first arrangement pattern and the second arrangement pattern.

10. The apparatus according to claim 1, wherein the processor is configured to generate the third arrangement pattern based on information obtained by enlarging an interval of arrangement positions of the imprint material in the first arrangement pattern by a first magnification, and information obtained by enlarging an interval of arrangement positions of the imprint material in the second arrangement pattern by a second magnification, the first magnification and the second magnification being different from each other.

11. The apparatus according to claim 1, wherein the processor is configured to generate the third arrangement pattern, such that a residual layer thickness of the pattern of the imprint material formed on the substrate by using the mold is uniform.

12. The apparatus according to claim 1, wherein the processor is configured to control the supplier such that the first arrangement pattern is adopted to a portion except for the boundary portion in the first portion of the mold, the second arrangement pattern is adopted to a portion except for the boundary portion in the second portion of the mold, and the third arrangement pattern is adopted to the boundary portion of the mold.

13. The apparatus according to claim 1,
wherein the processor is configured to:
partition the specified boundary portion of the mold into a plurality of partial portions,
generate the third arrangement pattern for each of the plurality of partial portions, such that the thickness of the pattern of the imprint material to be formed by each of the plurality of partial portions falls within the allowable range.

14. The apparatus according to claim 4, wherein the first direction and the second direction are parallel to a surface of the substrate onto which the imprint material is supplied by the supplier.

15. The apparatus according to claim 1, wherein the pattern configuration of the first portion of the mold is configured to mold the imprint material on a region on which an underlying pattern is already formed among the shot region, and the pattern configuration of the second portion of the mold is configured to mold the imprint material on a scribe region among the shot region.

* * * * *